(12) United States Patent
Canegallo et al.

(10) Patent No.: US 7,456,637 B2
(45) Date of Patent: Nov. 25, 2008

(54) MEASUREMENT ALIGNMENT SYSTEM TO DETERMINE ALIGNMENT BETWEEN CHIPS

(75) Inventors: Roberto Canegallo, Rimini (IT); Mauro Mirandola, Riolo Terme (IT); Alberto Fazzi, Finale Emilia (IT); Luca Magagni, Bologna (IT); Roberto Guerrieri, Bologna (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 251 days.

(21) Appl. No.: 11/519,425

(22) Filed: Sep. 11, 2006

(65) Prior Publication Data
US 2007/0067115 A1 Mar. 22, 2007

(30) Foreign Application Priority Data
Sep. 9, 2005 (EP) .................................. 05019639

(51) Int. Cl.
*G01R 27/26* (2006.01)
(52) U.S. Cl. ........................................ 324/662; 324/679
(58) Field of Classification Search ................... 324/68, 324/662, 665, 671, 672, 679, 686
See application file for complete search history.

(56) References Cited

U.S. PATENT DOCUMENTS

| | | | |
|---|---|---|---|
| 4,566,193 A | 1/1986 | Hackleman et al. | |
| 4,837,500 A * | 6/1989 | Abbringh | 324/660 |
| 6,495,396 B1 | 12/2002 | Drost | |
| 6,518,679 B2 | 2/2003 | Lu et al. | |
| 6,925,411 B1 | 8/2005 | Drost et al. | |
| 6,949,937 B2 * | 9/2005 | Knoedgen | 324/658 |
| 2002/0191835 A1 | 12/2002 | Ning et al. | |
| 2006/0097733 A1* | 5/2006 | Roziere | 324/662 |

FOREIGN PATENT DOCUMENTS

EP 0 507 099 A 10/1992

OTHER PUBLICATIONS

Kanda K. et al., "1.27Gb/s/pin 3mW/pin Wireless Superconnect (WSC) Interface Scheme", ISSCC Dig. Tech. Papers, pp. 186-187, Feb. 2003.

Karlsson N., "A Study of a High-Resolution Linear Circuit for Capacitive Sensors", IEEE Transactions on Instrumentation and Measurement, IEEE INc. New Yourk, US, vol. 48, No. 6, Dec. 1999, pp. 1122-1124.

Lee N K S, "An ultra-precision alignment system for micro machining", Industrial Technology, 2002, IEEE ICIT '02. 2002 IEEE International Conference on Dec. 11-14, 2002, Piscataway, NJ, USA, IEEE, vol. 2, Dec. 11, 2002, pp. 1142-1145.

(Continued)

*Primary Examiner*—Vincent Q Nguyen
(74) *Attorney, Agent, or Firm*—Lisa K. Jorgenson; Bryan A. Santarelli; Graybeal Jackson LLP

(57) ABSTRACT

An embodiment of the present invention relates to a alignment measurement system for measuring alignment between a plurality of chips of a device, the chips being assembled in a three-dimensional stacking configuration and equipped with at least an integrated capacitive sensor, including a multiple-capacitor structure integrated in the capacitive sensor, at least a sensing circuit connected to the multiple-capacitor structure which issues an output voltage, proportional to a variation of a capacitive value of the multiple-capacitor structure of the integrated capacitive sensor of the device and corresponding to a measured misalignment between the chips of the device.

19 Claims, 8 Drawing Sheets

OTHER PUBLICATIONS

Olson M et al., "Sub-micrometre precision measurement method for wafer level assembly", Transducers, Solid-State Sensors, Actuators and Microsystems, 12th Innational Conference on, 2003, Piscataway, NJ, USA, IEEE, vol. 2, Jun. 9, 2003, pp. 1486-1489.

Drost R et al., "7.7—Electronic Alignment for Proximity Communication" Solid-State Circuits Conference, 2004. Digest of Technical Papers. ISSCC. 2004 IEEE International San Francisco, CA, USA, Feb. 15-19, 2004, Piscataway, NJ, USA, IEEE, Feb. 15, 2004, pp. 144-153.

Wolffenbuttel M R et al., "The read-out characteristics of an integrated charge amplifier for potentially broad-filed applications", Proceedings of the International Symposium on Circuits and Systems. San Diego, May 10-13, 1992, Proceedings of the International Symposium on Circuits and Systems, (ISCAS), New York, IEEE, US, vol. 4 conf. 25, May 3, 1992, pp. 2356-2359.

Kanda K. et al., "1.27Gb/s/pin 3mW/pin wireless superconnect wsc interface scheme", ISSCC Dig. Tech. Papers, pp. 186-187, Feb. 2003.

European Search Report for EP 05 01 9639 dated Nov. 16, 2005.

* cited by examiner

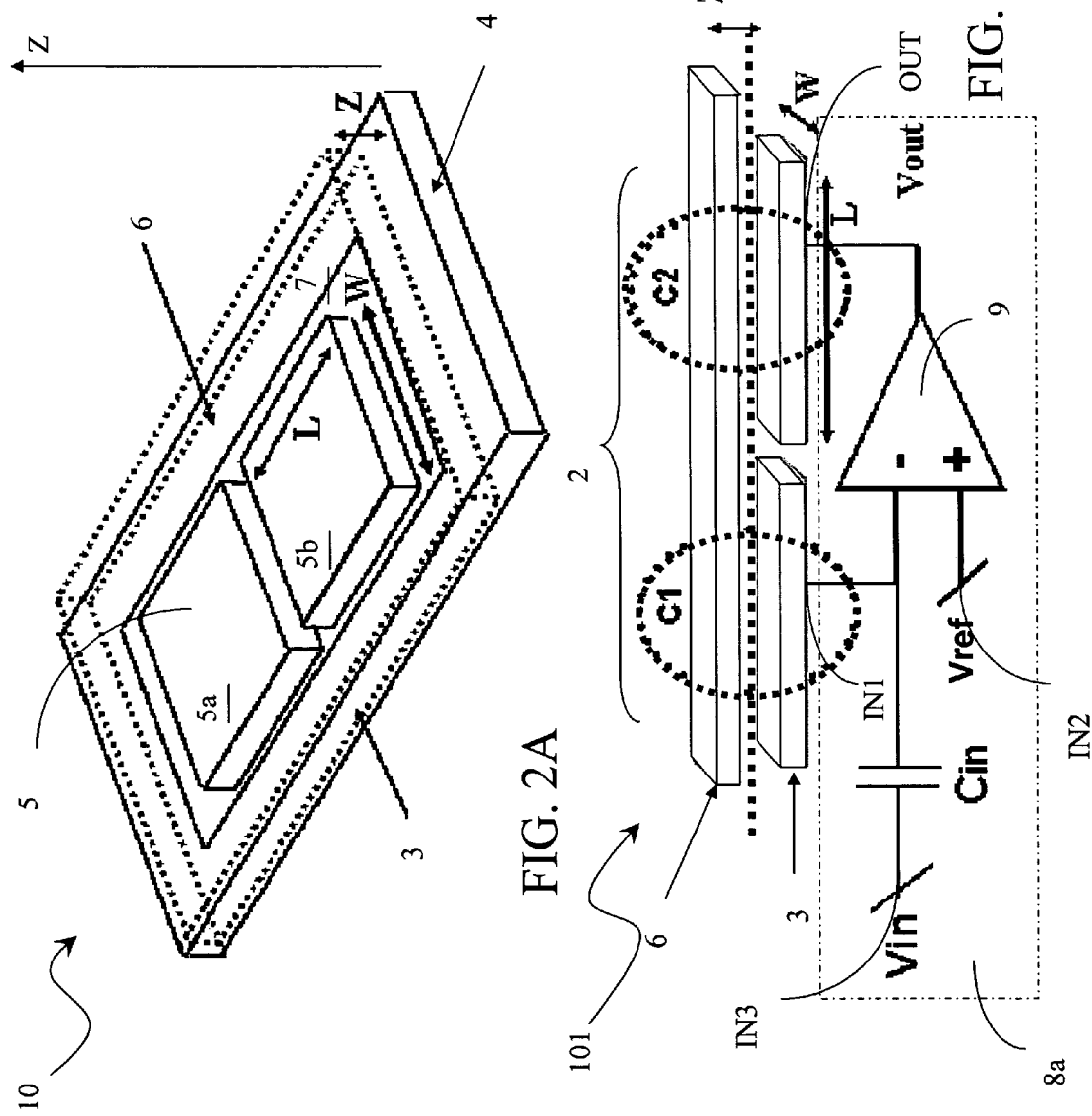

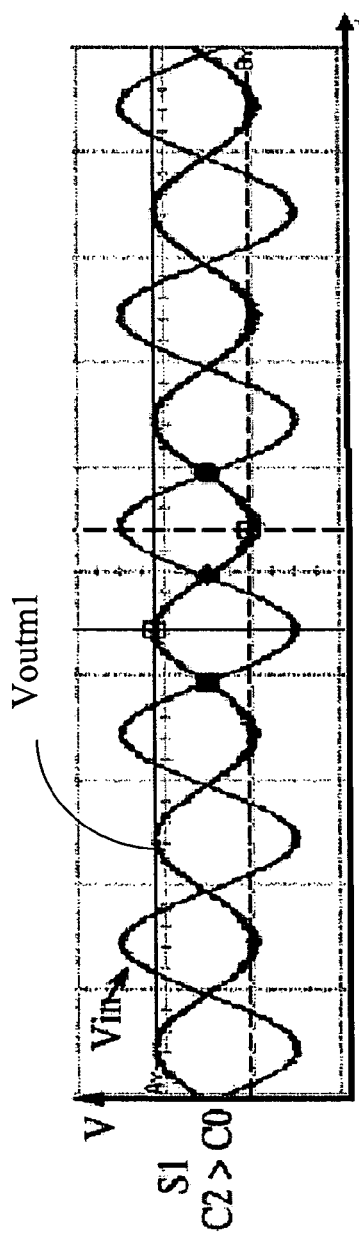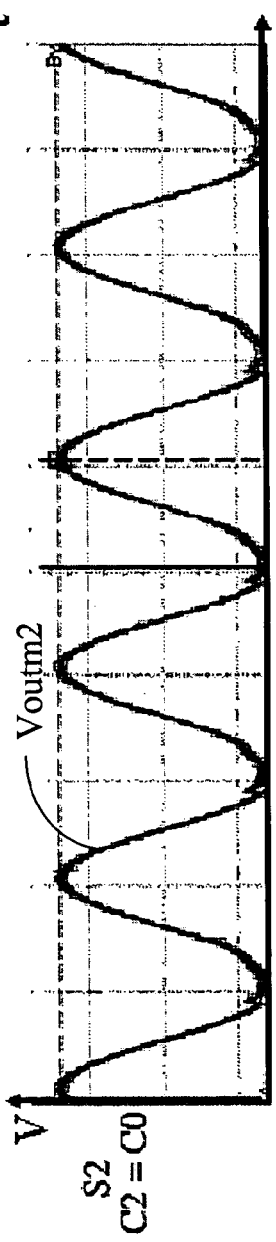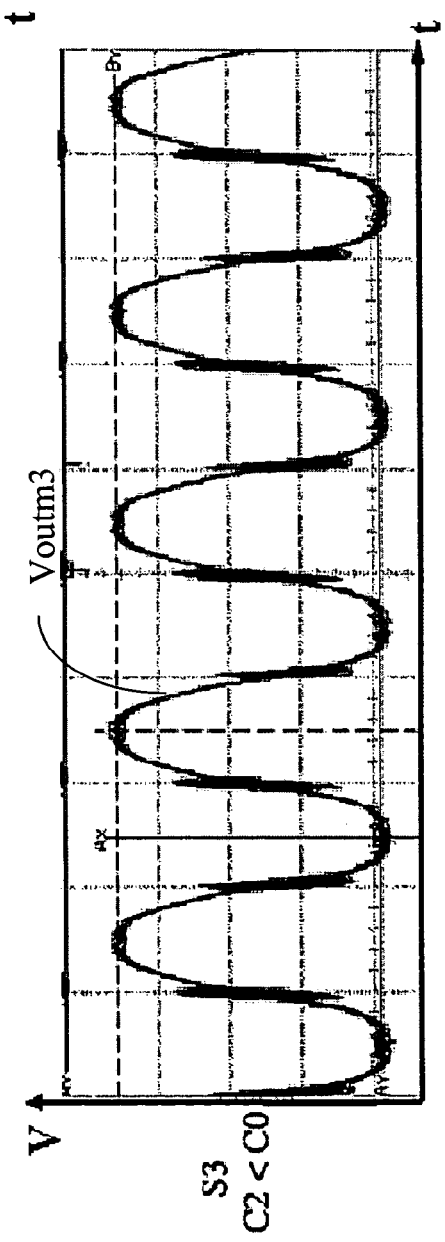
FIG. 6A
FIG. 6B
FIG. 6C

US 7,456,637 B2

MEASUREMENT ALIGNMENT SYSTEM TO DETERMINE ALIGNMENT BETWEEN CHIPS

PRIORITY CLAIM

The present application claims priority from European patent application no. 05019639.3, filed Sep. 9, 2005, which is incorporated herein by reference.

TECHNICAL FIELD

An embodiment of the present invention relates to an alignment measurement system to determine alignment between chips.

More specifically, an embodiment of the invention relates to an alignment measurement system for measuring alignment between a plurality of chips of a device, the chips being assembled in a three-dimensional stacking configuration and equipped with at least an integrated capacitive sensor, the system being inserted between first and second voltage references and connected to the device.

BACKGROUND

As it is well known, the development of stacking technology for heterogeneous device integration has recently increased in importance.

Stacking of chips, in which two or more integrated circuits or ICs of different types are placed one on the top of the other in a same package, is an alternative to silicon integration and may provide improvements at the system design level in terms of size, cost, speed, power consumption and ease of application for a wide variety of products.

However, successful implementation of the stacking or 3D technology requires dealing with state-of-the-art of assembly processes such as wafer back-grinding, handling, die attach, wirebond and alignment. So, the choice of a stacking or 3D technology depends largely on the application of the final chip so obtained.

In particular, vertical data communication using AC wireless interconnect has been recently presented as very promising stacking or 3D technology for high-bandwidth, high speed applications, as described in the article to Kanda K. et al. entitled "1.27 Gb/s/pin 3 mW/pin wireless superconnect wsc interface scheme", ISSCC Dig. Tech. Papers, pp. 186-187, February 2003, which is incorporated by reference.

In this field of application, in order to improve the interchip communication efficiency, a very accurate and precise alignment of the stacked chips is often required.

Many strategies have been presented to make chip positioning with sub-micron precision possible. Known alignment systems and methods allowing a sub-micron precision are described for instance in the following articles:

Neville K. S Lee, "An-Ultra precision alignment system for Micro-machining", IEEE ICIT 2002;

M. Olson et al, "Sub-micrometer precision measurement method for wafer level assembly", International Conference on Solid State Sensors, Actuators and Microsystem June 2003; and R. J. Drost et al., "Electronic Alignment for Proximity Communication", ISSCC Dig. Tech. Papers, pp. 144-145, February 2004, all of which are incorporated by reference.

Also known from U.S. Pat. No. 4,566,193, which issued on Jan. 28, 1986 and which is incorporated by reference, is an electronic vernier which detects and quantifies misalignment between layers of deposited material on a semiconducting wafer, in particular during a semiconductor manufacturing process.

Furthermore, U.S. Pat. No. 6,518,679, which issued on Feb. 11, 2003 and which is incorporated by reference, describes a capacitive alignment structure and method for chip stacking.

Some of these known approaches require expensive and complex servomechanisms, sensors and actuators. Moreover, the methods and systems actually available in the field are typically not standard but are tailored to a specific application of a final stacked device to be realized.

SUMMARY

An embodiment of the present invention is a system for measuring alignment between chips, in particular assembled in a three-dimensional (3D) stacking configuration, having structural and functional characteristics which allow a sub-micron precision in measuring chip positioning without requiring expensive and complex components, in this way overcoming the limits which still affect systems realized according to the prior art.

This embodiment of the present invention associates with at least an integrated CMOS capacitive sensor connected to the chips comprised in a three-dimensional (3D) stacking configuration a sensing circuit to provide an on-chip measurement of a stacked configuration alignment along vertical Z-axis or lateral X/Y-axis.

BRIEF DESCRIPTION OF THE DRAWINGS

Characteristics and advantages of a system will be apparent from the following description of embodiments thereof given by way of indicative and non-limiting example with reference to the annexed drawings.

FIGS. 2A and 2B show a cross section of a second embodiment of an alignment measurement system according to the present invention and its sensing principle, respectively;

FIGS. 6A-6C show measured signal waveforms of the system of FIG. 3 according to an embodiment of the invention;

DETAILED DESCRIPTION

The use of integrated capacitive sensors may meet the demand for low-cost, high resolution, high-reproducibility measurement systems.

Figures 1A, 1B:
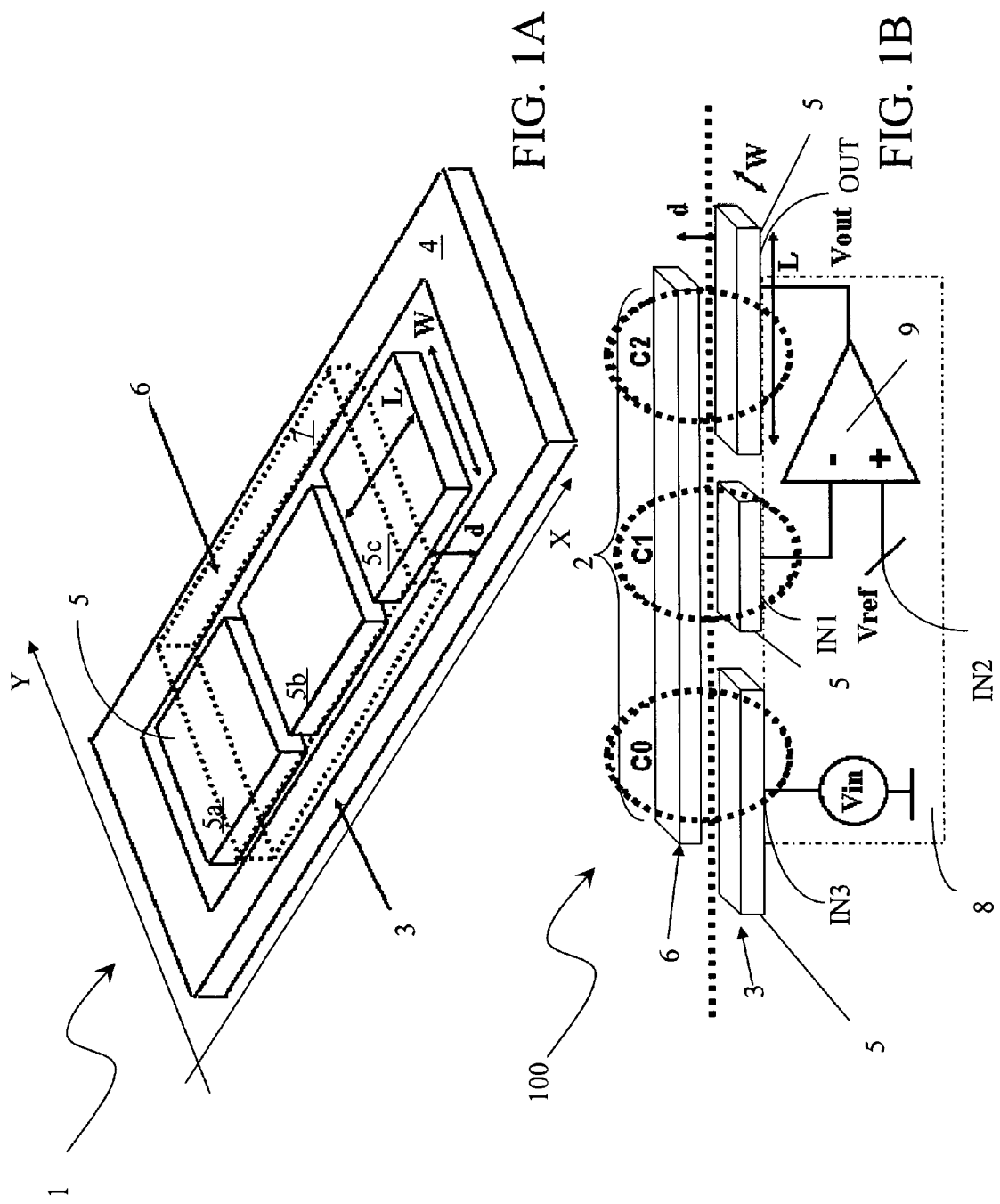
FIGS. 1A and 1B show a cross section of a first embodiment of an alignment measurement system according to the present invention and its sensing principle, respectively.

With reference to the figures, and in particular to FIGS. 1A and 1B, a first embodiment of an integrated sensor used in a alignment measurement system according to the present invention is schematically shown and generally indicated at 1.

The integrated sensor 1 comprises a bottom die 3 including a plurality of bottom electrodes 5 surrounded by a guard ring 4 and overlaid by a top die 6 forming a top electrode 7.

In particular, in the example shown in FIG. 1A, the bottom die 3 comprises three bottom electrodes 5a, 5b and 5c, in order to realize a four-electrode integrated sensor 1 able to measure alignment of stacked devices along the X or Y axis.

Generally, the bottom electrodes 5 comprise at least a top metal layer and are electrically insulated, by a dielectric or passivation layer (inter-chip medium), for instance silicon oxide, from the top electrode 7, which comprises at least a metal layer.

In other words, the top and bottom electrodes or dies are stacked together in a three-dimensional configuration (with respect to the metal, i.e., conductive layer) and the passivation layer of silicon oxide is used as dielectric to build a capacitor.

Advantageously in this embodiment the top electrode 7 does not completely overlap the lateral electrodes 5a and 5c.

In this way, a multiple-capacitor structure 2 is realized, a first capacitor C0, a second capacitor C1, and a third capacitor C2 being formed by the top electrode 7 and bottom electrodes 5a, 5b and 5c, respectively, as indicated in FIG. 1B which shows the principle of operation of the integrated sensor 1 of FIG. 1A. As it will be clear from the following description, the multiple-capacitors structure 2 so obtained is used to encode a position information of chips assembled in a three-dimensional (3D) stacking configuration, the stacked device so realized being equipped and coupled by using at least an integrated sensor I as previously described. Assuming a parallel plate model, wherein the capacitor plates are the bottom electrodes 5a, 5b and 5c and the top electrode 7, the capacitance value of each capacitor of the multiple-capacitor structure 2 is then calculated from the equation:

$$C = \epsilon_0 \epsilon_r WL/d \qquad (1)$$

where:

$\epsilon_0$ is the dielectric constant in vacuum $\epsilon_r$ is the permittivity of the inter-chip medium W is a width of each bottom electrode 5a, 5b, 5c;

L is a length of each bottom electrode 5a, 5b, 5c; and d is a distance between the bottom electrodes 5a, 5b, 5c and the top electrode 7.

In FIG. 1A, the bottom electrodes 5a, 5b, 5c are shown as having the same width W and length L only for sake of simplicity, but each of such bottom electrodes could have different values for the width and length parameters. Furthermore, the bottom electrodes could be realized by different geometries (rectangles, rhombuses, circles, etc) or other materials.

It is clear that a shift or displacement of the top electrode 7, along the X or Y axis direction (defined with respect to a plane of the integrated sensor 1, i.e., of the top 6 and bottom die 3 thereof and shown in FIG. 1A) changes an overlapping area defined by the top electrode 7 and each of the bottom electrodes 5a, 5b, 5c and thus the capacitance values of the first C0 and third capacitor C2 of the multiple-capacitor structure 2 according to the above equation (1).

In particular, a first embodiment of an alignment measurement system 100 according to the invention as shown in FIG. 1B comprises a sensing circuit 8 having a first input terminal IN1 connected to a first terminal of the multiple-capacitor structure 2, a second input terminal IN2 connected to a generator of a reference voltage Vref, a third input terminal IN3 receiving an input voltage Vin, and an output terminal OUT also connected to a second terminal of the multiple-capacitor structure 2. The sensing circuit 8 is an analog integrated read-out circuit.

In particular, the first input terminal IN1 is connected to the bottom electrode 5b of the second capacitor C1, the third input terminal IN3 is also connected to the bottom electrode 5a of the first capacitor C0 and the output terminal OUT is connected to the bottom electrode 5c of the third capacitor C2.

The sensing circuit 8 comprises a differential amplifier 9 having a first input terminal corresponding to the first input terminal IN1, a second input terminal corresponding to the second input terminal IN2 and an output terminal corresponding to output terminal OUT.

In order to encode the position information of chips assembled in a three-dimensional (3D) stacking configuration, the sensing circuit 8 issues an output voltage Vout which is proportional to the input voltage Vin according to the following equation:

$$\frac{Vout}{Vin} \propto -\frac{C0}{C2} \qquad (2)$$

If the chips are symmetrically aligned, C0 is equal to C2, therefore the output voltage Vout is equal with an opposite phase with respect to the input voltage Vin. If the chips are misaligned, C0 is different from C2, therefore the output voltage Vout is greater or smaller than the input voltage Vin. So it is possible detected in which direction chips are shifted along the X or Y axis.

Advantageously, to reduce the electric-field bending effect and the external interference, the bottom electrodes 5 are surrounded by the guard ring 4, which is a grounded electrode.

Also advantageously, to compute coarse and fine alignment measurement, the bottom electrodes 5 are realized as a comb of metal stripes with different sizes and pitches.

So, an X/Y-Axis or lateral integrated sensor 1 is obtained in a simple and accurate manner. The lateral integrated sensor 1 can be used to determine the misalignment between chips assembled in a three-dimensional (3D) stacking configuration, by properly connecting at least an integrated sensors 1 to the chips, a measure of the misalignment along X/Y axis could be thus simply obtained.

It is also possible to embed the integrated sensor 1 within a top chip and to a bottom chip that have to be alignment, the top die 6 being integrate in the top chip and the bottom die 3 and the sensing circuit 8 being integrate in the bottom chip.

In this case, it should be noted that, advantageously according to an embodiment of the invention, by using the above-described four-electrode integrated sensor 1 along with the sensing circuit 8, it is not necessary that the top chip is powered.

A second embodiment of an integrated sensor having a similar structure with respect to the integrated sensor 1 is schematically shown in FIG. 2A and generally indicated at 10. The integrated sensor 10 is also used in an alignment measurement system according to an embodiment of the present invention.

For sake of clarity, the same reference numbers will be used to indicate parts of the integrated sensor 10 which structurally and/or functionally correspond to the ones described with reference to the integrated sensor 1 shown FIGS. 1A and 1B.

So, the integrated sensor 10 comprises a multiple-capacitor structure 2, in this case in a three-electrode scheme.

In particular, the integrated sensor 10 comprises a bottom die 3 including a plurality of bottom electrodes 5 surrounded by a guard ring 4 and overlaid by a top die 6 that forms a top electrode 7.

In this case, as shown in FIG. 2A, the bottom die 3 comprises two bottom electrodes 5a and 5b. It should be noted that the top electrode 7 fully overlaps the bottom electrodes 5a and 5b, so obtaining a two series-connected capacitors structure 2 and thus a three-electrode integrated sensor 10 able to measure alignment of stacked devices along Z-axis.

As previously described, in an embodiment, the bottom electrodes 5a, 5b comprise at least a metal layer and are electrically insulated, by a dielectric or passivation layer, for instance silicon oxide, from the top electrode 7, which comprises at least a metal layer, in three dimensional configuration as above explained.

The multiple-capacitor structure 2 comprises a first C1 and a second capacitor C2 being formed by the top 7 and bottom electrodes 5a, 5b, respectively, as indicated in FIG. 2B which shows the principle of operation of the integrated sensor 10 of FIG. 2A.

In this second embodiment of an alignment measurement system 101 according to the invention, the integrated sensor 10 is connected to a sensing circuit 8a, in turn connected to the multiple-capacitor structure 2. In particular, the sensing circuit 8a has a first input terminal IN1 connected to a first terminal of the multiple-capacitor structure 2, a second input terminal IN2 connected to a generator of a reference voltage Vref, a third input terminal IN3 receiving an input voltage signal Vin (not shown) and an output terminal OUT also connected to a second terminal of the multiple-capacitor structure 2. In this case, the sensing circuit 8a is a charge integrator.

The generator of a reference voltage Vref can be provided by an internal or external source.

In particular, the first input terminal IN1 is connected to the bottom electrode 5a of the first capacitor C1, and the output terminal OUT is connected to the bottom electrode 5b of the second capacitor C2.

The first input terminal IN1 is also connected, through a reference capacitor Cin, to the third input terminal IN3.

The sensing circuit 8a comprises a differential amplifier 9 having a first input terminal corresponding to the first input terminal IN1, a second input terminal corresponding to the second input terminal IN2 and an output terminal corresponding to the output terminal OUT.

It should be noted that the bottom electrodes 5a, 5b are connected separately to the first input terminal IN and to the output terminal OUT.

In this way, the first and second capacitors C1, C2 of the multiple-capacitor structure 2 are substantially a feedback capacitor structure for the differential amplifier 9 whose value Cz corresponds to the series of these first and second capacitors C1, C2 and the sensing circuit 8a is thus a charge integrator.

So, the sensing circuit 8a issues an output voltage Vout whose differential ΔVout is proportional to a differential ΔVin of the input voltage Vin according to the following equation:

$$\Delta Vout = -\frac{Cin}{Cz}\Delta Vin \quad (3)$$

where

-continued $$Cz = \frac{C1*C2}{C1+C2} \quad (4)$$

Since the feedback capacitor Cz is inversely proportional to a vertical distance z between the top and bottom dies 6, 3 along a Z-axis direction (defined as a normal with respect to a plane of the integrated sensor 1, i.e., of the top 6 and bottom dies 3 thereof and shown in FIG. 2A) while the output voltage Vout of the differential amplifier 9 is inversely proportional to the feedback capacitance value Cz, a linear dependence of output voltage Vout on the vertical distance d is so obtained.

So, a Z-Axis or vertical integrated sensor 10 is obtained in a simple and accurate manner. The integrated sensor 10 can be used to determine the distance or separation between chips assembled in a three-dimensional (3D) stacking configuration, because by properly connecting at least an integrated sensor 10 to the chips, a measure of the distance along a Z axis could be thus simply obtained.

It is also possible to embed the integrated sensor 10 on the chips themselves, the top die 6 being thus a top chip and the bottom die 3 being a bottom chip.

Figure 3:
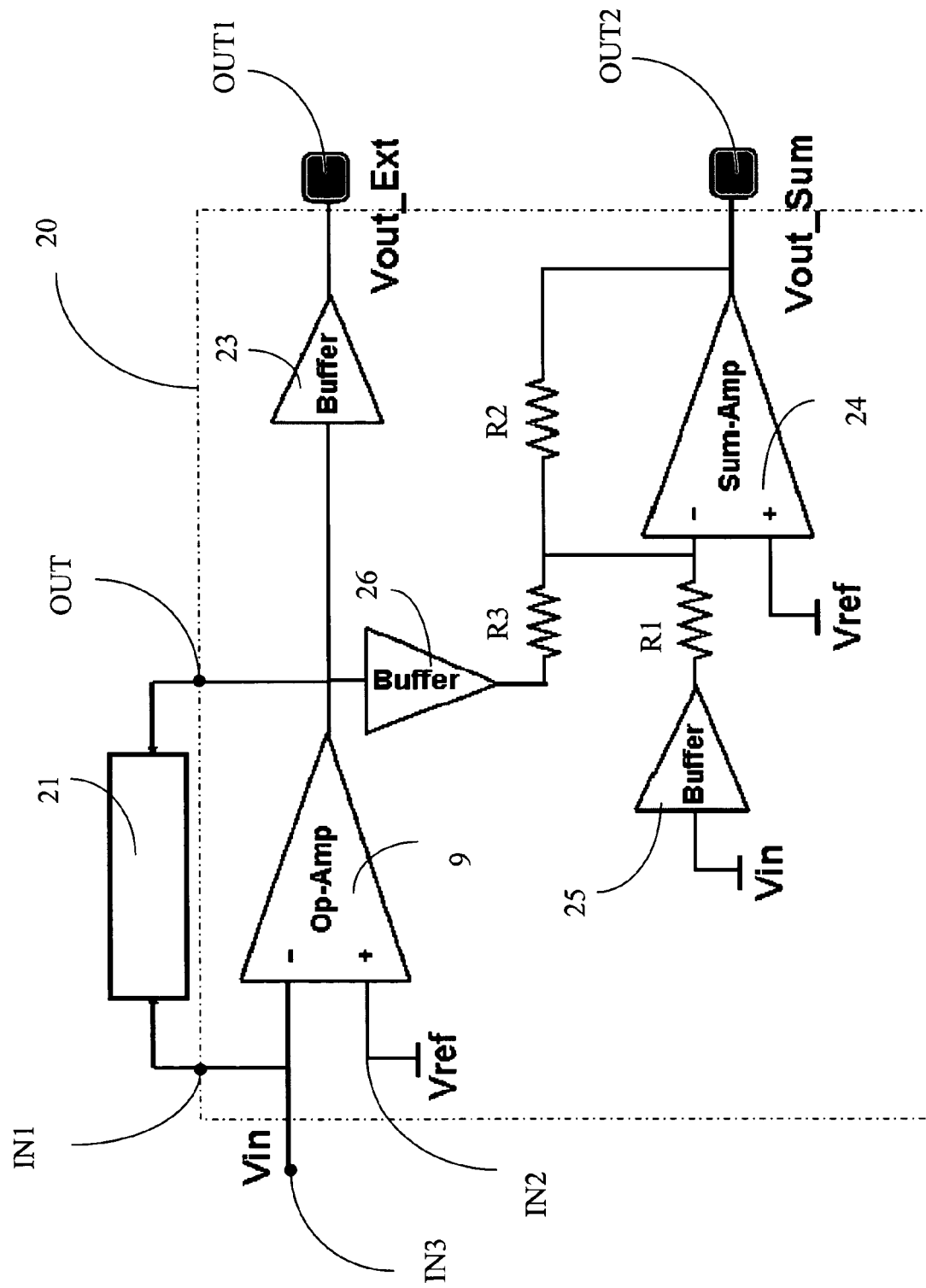
FIG. 3 shows an additional measurement system according to an embodiment of the present invention.

Advantageously according to an embodiment of the invention, by using lateral integrated sensors 1 as previously described, an additional measurement system, as shown in FIG. 3, globally indicated at 20, may be used.

Advantageously according to an embodiment of the invention, the additional measurement system 20 comprises the sensing circuit 8 corresponding to one described with reference to FIG. 1B.

As previously described with reference to FIG. 1B, the sensing circuit 8 has a first input terminal IN1 connected to the lateral integrated sensor 1 and therefore to device 21, a second input terminal IN2 connected to a generator of a reference voltage Vref, a third input terminal IN3 connected to a generator of an input voltage Vin, and an output terminal OUT, also connected to the device 21.

In particular, the output terminal OUT of the sensing circuit 8 is also connected, through a first buffer 23, to a first output terminal OUT1 of the additional measurement system 20, such first output terminal OUT1 issuing a first output voltage signal Vout_Ext.

In this way, the first output voltage signal Vout_Ext is proportional to the output voltage Vout of the sensing circuit 8, which is proportional to the input voltage Vin and to the capacitive value of the multiple-capacitor structure 2. In other words, the first output voltage signal Vout_Ext is a measure of the displacement between electrodes of the integrated sensors of the device 21.

Furthermore, the additional measurement system 20 comprises a sum amplifier 24 having a first input terminal connected, through a series of a second buffer 25 and a first resistor R1 to the generator of the input voltage Vin, a second input terminal connected to the generator of the reference voltage Vref, and an output terminal connected to a second output terminal OUT2 of the additional alignment measurement system 20, such second output terminal OUT2 issuing a second output voltage signal Vout_Sum.

Nothing prevents one from forming the sum amplifier 24 as a different circuit able to determine the amplitude of the output voltage of sensing circuit Vout (for example an analog multipliers).

Advantageously, the second output terminal OUT2 is used to feed data back to an external manipulator to validate and compare the alignment information obtained by the additional measurement system 20.

The output terminal of the sum amplifier 24 is also connected to its first input terminal by means of a second resistor R2 and to the output terminal OUT of the sensing circuit 8 through a series of the second resistor R2, of a third resistor R3 and of a third buffer 26.

In particular, the first and second output voltage signals Vout_Ext and Vout_Sum are derived from the output voltage Vout issued from the output terminal OUT of the differential amplifier 8. It should be remarked that the output voltage Vout is in turn proportional to the charge variation of the multiple-capacitor structure 2. So, the first output voltage signal has the information about the direction of the displacement while the second output voltage signal Vout_sum provides the entity of the displacement.

It should be noted that, advantageously according to an embodiment of the present invention, the summing amplifier 24 feeds back the second output voltage signal Vout_Sum to an off-chip micromanipulator (not shown in the figures) that drives known placement machines, thus creating a closed-loop for a precise placement of the chips in the three-dimensional (3D) stacking configuration of the stacked device.

As previously explained, the sensing circuit 8 may be differently configured whether the stacked device 21 is equipped with a lateral integrated sensor 1 or with a vertical integrated sensor 10.

Figure 4A:
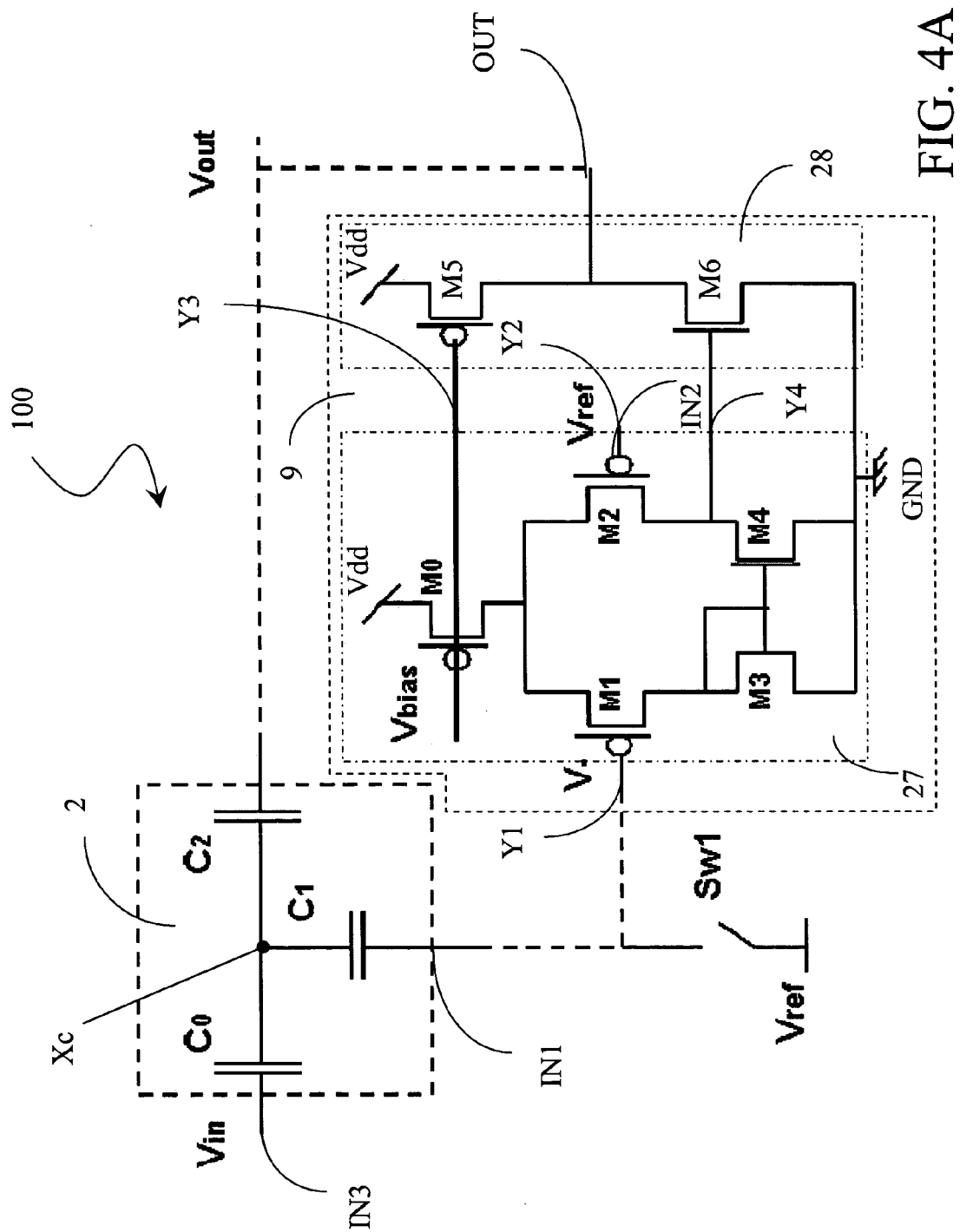
FIG. 4A shows details of the system of FIG. 1B according to an embodiment of the invention.

Advantageously, when the stacked device 21 comprises lateral integrated sensors 1, the sensing circuit 8 is a low impedance AC read-out circuit, as shown in FIG. 4A.

As already explained with reference to FIG. 1B, the sensing circuit 8 comprises a differential amplifier 9 connected to the multiple-capacitor structure 2.

In particular, the sensing circuit 8 has a first input terminal IN1 connected to the multiple-capacitor structure 2, in particular to a first end of the second capacitor C1 having in turn a second end connected, at a central node Xc, to a first end of the third capacitor C2, which has a second end connected to the output terminal OUT of the sensing circuit 8.

The sensing circuit 8 also has a third input terminal IN3 connected to the generator of the input voltage Vin and to the multiple-capacitor structure 2, in particular to a first end of the first capacitor C0, having in turn a second end connected, at the central node Xc, to the second end of the second capacitor C1 as well as to the first end of the third capacitor C2. The output terminal OUT issues the output voltage Vout.

Advantageously according to an embodiment of the present invention, the differential amplifier 9 comprises an operational amplifier 27 cascade-connected to an output stage 28, as shown in FIG. 4A.

In particular, the operational amplifier 27 is inserted between a first and a second voltage reference, in particular a supply voltage reference Vdd and a ground GND, and has a first input terminal Y1 connected to first input terminal IN1 of the sensing circuit 8, in turn connected to a generator of a reference voltage Vref by means of a switch SW1. The operational amplifier 27 also has a second input terminal Y2 connected to the generator of the reference voltage Vref and the second input terminal IN2.

Furthermore, the operational amplifier 27 has a first output terminal Y3 and a second output terminal Y4 connected to the output stage 28.

The operational amplifier 27 comprises a first transistor M1 and a second transistor M2 connected to the ground GND by respectively third M3 and fourth transistors M4 and to the supply voltage reference Vdd by means of a bias transistor M0, having a control or gate terminal connected to a generator of a bias voltage Vbias.

In particular, the first transistor M1 has a first conduction terminal connected to the bias transistor M0 and a second conduction terminal connected to a first conduction terminal of the third transistor M3, having in turn a second conduction terminal connected to ground GND.

The first transistor M1 has a control or gate terminal connected to the first input terminal Y1 of the operational amplifier 27.

In an analogous manner, the second transistor M2 has a first conduction terminal in common with the first conduction terminal of the first transistor M1 and connected to the bias transistor M0 and a second conduction terminal connected to a first conduction terminal of the fourth transistor M4, having in turn a second conduction terminal connected to ground GND.

The second transistor M2 has a control or gate terminal connected to the second input terminal Y2 of the operational amplifier 27.

Also, the third transistor M3 and fourth transistor M4 have the control or gate terminals connected to each other, the third transistor M3 being diode-connected.

Finally, the gate terminal of the bias transistor M0 is connected to a first output terminal Y3 of the operational amplifier 27 and the second conduction terminal of the second transistor M2, which is connected to the first conduction terminal of the fourth transistor M4, is also connected to a second output terminal Y4 of the operational amplifier 27.

Moreover, the output stage 28 comprises a fifth transistor M5 and a sixth transistor M6 which are series-connected between the supply voltage reference Vdd and ground GND.

In particular, the fifth transistor M5 has a first conduction terminal connected to the supply voltage reference Vdd and a second conduction terminal connected to a first conduction terminal of the sixth transistor M6, having in turn a second conduction terminal connected to ground GND.

Also, the fifth transistor M5 has a control or gate terminal connected to the first output terminal Y3 of the operational amplifier 27 and the sixth transistor M6 has a control or gate terminal connected to the second output terminal Y4 of the operational amplifier 27.

Finally, the second conduction terminal of the fifth transistor M5, which is connected to the first conduction terminal of the sixth transistor M6, is also connected to the output terminal OUT of the sensing circuit 8.

In this way, the output voltage Vout is computed by means of the charge conservation principle. Assuming that the operational amplifier 27 is in virtual ground and infinite gain condition, the following equation can be derived:

$$Vout \approx -\frac{C0}{C2}Vin + \frac{Co+C2}{C2}Vref \qquad (5)$$

Considering as input voltage Vin a sinusoidal signal applied to one end of the first capacitor C0, and thus to the first electrode 5a of the integrated sensor 1, a charge variation δQ is induced on the second capacitor C1, i.e., on the central electrode 5b.

This charge variation δQ is detected by the operational amplifier 27 and, due to the feedback loop realized by connecting the output terminal OUT to the multiple-capacitor structure 2, it produces a corresponding charge variation on the third capacitor C2, i.e., on the third electrode 5c which acts as a pick-up electrode.

According to the above equation (4), the output voltage Vout is thus a sinusoidal waveform proportional to a C0/C2 ratio and with opposite phase with respect to the input sinusoidal signal Vin.

Advantageously according to an embodiment of the invention, an on-chip-generated or external-analog-reference level Vref, is provide to the amplifier and buffer of alignment measurement system 20.

In an embodiment of the invention considering a single power supply voltage Vdd of 1.2 Volt, the sine wave input voltage Vin has a frequency equal to substantially 1 MHz to obtain a voltage reference Vref equal to Vdd/2.

For example, using a bias current of 10 µA, a gain of 42 dB is achieved by the operational amplifier 27.

The switch SW1 allows to pre-charge and to reset the first input terminal Y1 to a fixed bias voltage value, equal to the voltage reference Vref, during a measurement performed by the alignment measurement system 100 to avoid saturation of the amplifier circuits 8.

Advantageously according to an embodiment of the invention, the operational amplifier 27 is a low impedance AC high-gain amplifier. In this way, the alignment measurement system 100 comprising the sensing circuit 8 has better performance with low voltage rails because of a better common mode range of the operational amplifier 27 that can thus be used to linearize the output voltage signal Vout.

Figure 4B:
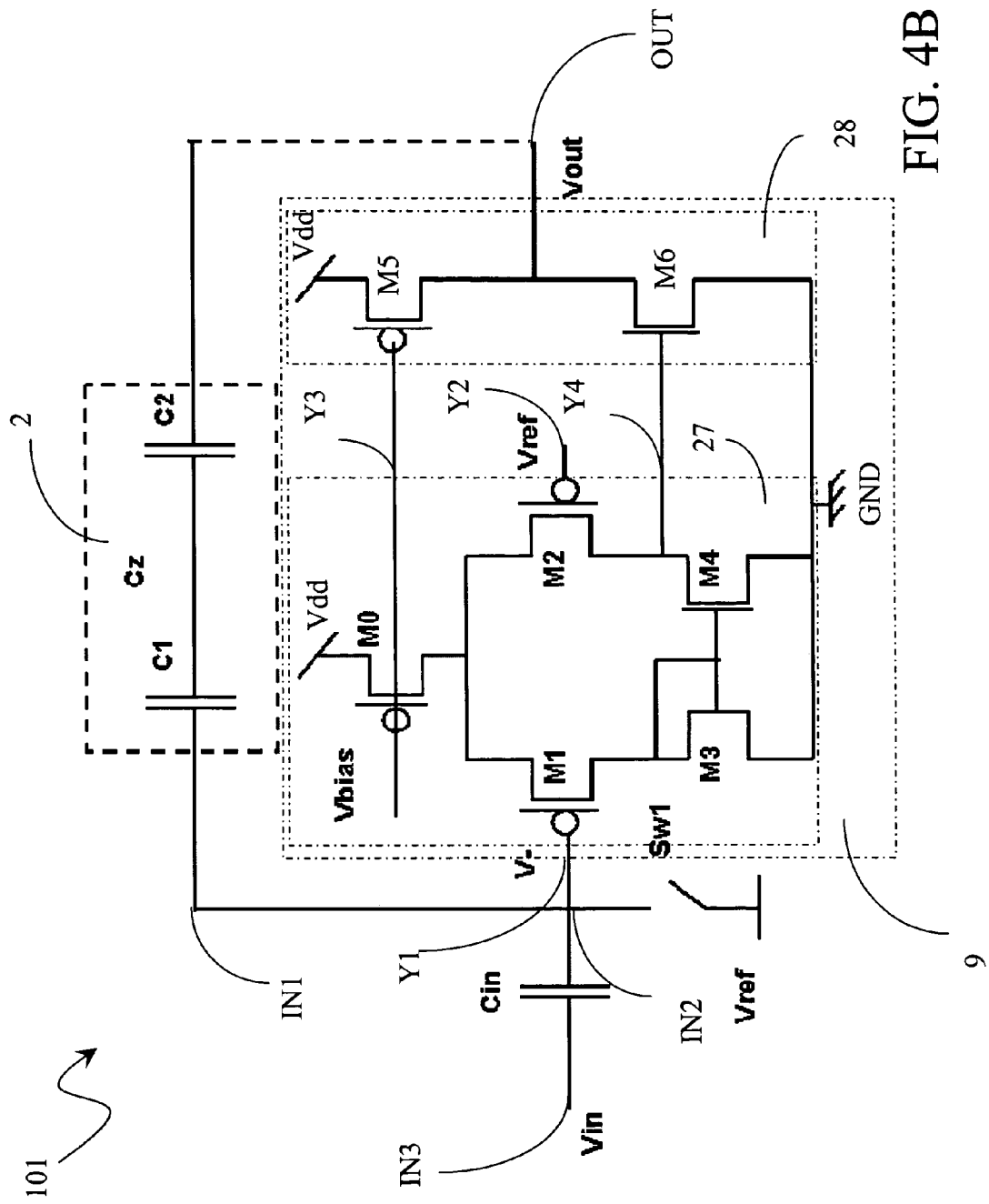
FIG. 4B shows details of the system of FIG. 2B according to an embodiment of the invention.

In a similar manner, when the stacked device 21 comprises vertical integrated sensors 10, the sensing circuit 8a is a charge-voltage sensing amplifier, as shown in FIG. 4B.

As already explained with reference to FIG. 2B, the sensing circuit 8a comprises a differential amplifier 9 connected to the multiple-capacitor structure 2.

In particular, the sensing circuit 8a has a first input terminal IN1 connected to the multiple-capacitor structure 2, in particular to a first end of the first capacitor C1, having in turn a second end connected to a first end of the second capacitor C2 which has a second end connected to the output terminal OUT. The sensing circuit 8a also has a first input terminal IN1 connected, by means of a switch SW1, to the generator of the reference voltage Vref and, though the input capacitor Cin, to the third input terminal IN3, in turn connected to the generator of the input voltage Vin. The output terminal OUT issues the output voltage Vout.

As already explained with reference to FIG. 4A, the differential amplifier 9 comprises an operational amplifier 27 cascade-connected to an output stage 28.

In this case, the charge amplifier realized by the sensing circuit 8a issues an output voltage Vout computed as:

$$\Delta Vout \approx -\frac{Cin}{Cz}\Delta Vin \quad (6)$$

being Cin the value of the reference capacitance and Cz the value of feedback capacitance given by:

$$Cz = \frac{Ci*C2}{C1+C2} \quad (7)$$

As above explained, Cz is inversely dependent on the vertical distance between the electrodes of the vertical integrated sensor 10, i.e., between two chips of a stacked device, the chips being equipped with the vertical integrated sensor 10.

In the examples shown in FIGS. 4A and 4B, the transistors M2, M3, M4 and M5 are NMOS and the transistors M0, M1 and M6 are PMOS.

In an embodiment of the invention and referring again to FIGS. 2B, 3, and 5, the first buffer 23 is configured as a unity gain buffer by comprising an operation amplifier 27 and an output stage 28 as the differential amplifier 9, as well as an intermediate block 30, as shown in FIG. 5.

For sake of clarity, the same reference numbers will be used to indicate parts of the first buffer 23 which structurally and/or functionally correspond to the ones described with reference to the differential amplifier 9 shown FIGS. 4A and 4B.

The intermediate block 30 is inserted between the supply voltage reference Vdd and ground GND and has a first input terminal Y6 connected to the first input terminal Y1 of the operational amplifier 27, a second input terminal Y7 connected to the second input terminal Y2 of the operational amplifier 27 and an output terminal Y8 connected to the output stage 28, in particular to the gate terminal of the fifth transistor M5 of the output stage 28, while the gate terminal of the sixth transistor M6 of the output stage 28 is connected to the second output terminal Y4 of the operational amplifier 27.

In particular, the intermediate block 30 comprises a first transistor M8 having a first conduction terminal connected, through a mirror block 31, to the supply voltage reference Vdd, a second conduction terminal connected, through a bias transistor M7, to ground GND and a control or gate terminal connected to first input terminal Y6.

The intermediate block 30 also comprises a second transistor M9 having a first conduction terminal connected, through the mirror block 31, to the supply voltage reference Vdd, a second conduction terminal connected to the second conduction terminal of the first transistor M8 and, through the bias transistor M7, to ground GND and a control or gate terminal connected to second input terminal Y7.

The first and second transistors M8 and M9 of the intermediate block 30 substantially form a differential cell.

The first conduction terminal of the second transistor M9 is also connected to the output terminal Y8 of the intermediate block 30.

The bias transistor M7 has a first conduction terminal connected to the second conduction terminals of the first and second transistors M8 and M9, a second conduction terminal connected to ground GND and a control or gate terminal connected to a generator of a second bias voltage Vbias2.

The mirror block 31 comprises a third transistor M10 having a first conduction terminal connected to the supply voltage reference Vdd, a second conduction terminal connected to the first conduction terminal of the first transistor M8 of the intermediate block 30 and a control or gate terminal connected to a control or gate terminal of a fourth transistor M11, having in turn a first conduction terminal connected to the supply voltage reference Vdd and a second conduction terminal connected to the first conduction terminal of the second transistor M9 of the intermediate block 30, the third transistor M10 being diode-connected.

Figure 5:
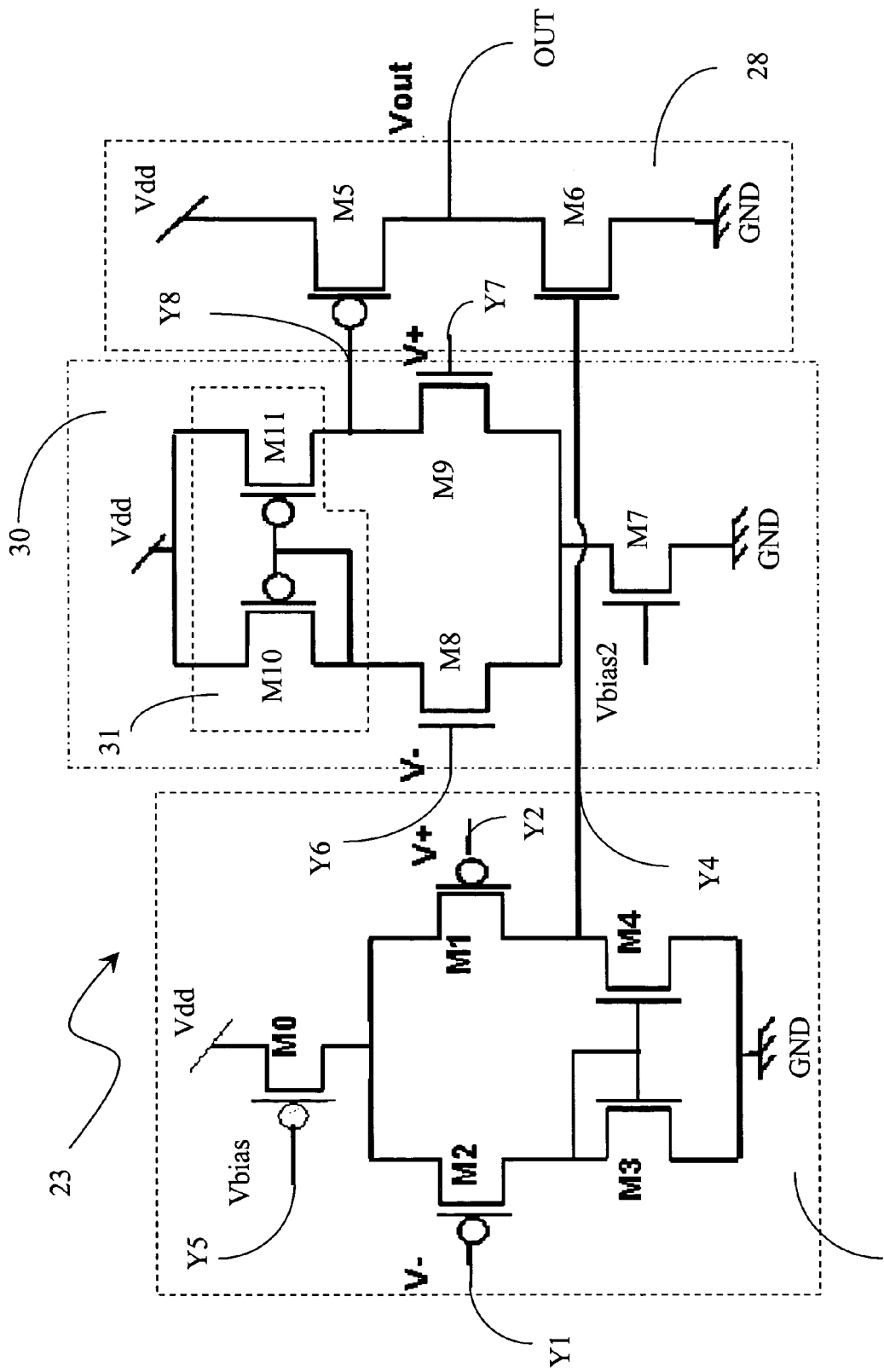
FIG. 5 shows details of the system of FIG. 3 according to an embodiment of the invention.

In the example shown in FIG. 5, the transistors M7, M8 and M9 are NMOS and the transistors M10 and M11 are PMOS.

In this way, the differential amplifier 9 correctly provides external pins with the output voltage Vout for testing, the external pins being connected to the first output terminal OUT1 of the alignment measurement system 100 (FIGS. 3 and 4A).

It should be noted that, advantageously according to an embodiment of the invention, the unity-gain-buffer configuration of the differential amplifier 9 with the intermediate block 30 is able to drive external pins.

In an embodiment, an AC input signal Vin being a sinewave is used, this kind of signal allowing simplified comparison between applied and measured values and it allows filtering the noise and providing better performance in term of the signal-to-noise ratio.

For example, the size of electrodes for the integrated sensors are 120 µm×30 µm.

In particular, FIG. 6B shows a measured output voltage Voutm2 in a perfect alignment condition (plot S2) of the upper 7 and bottom electrodes 5 of an integrated sensor 1. In this case, the capacitance values C0 and C2 of the multiple-capacitor structure 2 are the same, the differential amplifier 9 works like a buffer, and, as a result, the measured output voltage Voutm2 has the same amplitude of the input voltage Vin.

Analogously, FIG. 6A shows a measured output voltage Voutm1 in case of a right displacement (e.g., positive displacement of the die 6 along the X axis in FIG. 1A) along one direction (plot S1) and FIG. 6C shows a measured output voltage Voutm3 in case of a left displacement (e.g., negative displacement of the die 6 along the Y axis in FIG. 1A) along one direction (plot S3).

In particular, when the upper electrode 7 is left-shifted over the bottom electrodes 5, the measured output voltage Voutm3, which is a sinusoidal waveform, has a bigger amplitude than the input voltage Vin, since the first capacitor C0 value is greater than the third capacitor C2 value.

Moreover, in case of an opposite movement, i.e., when the upper electrode 7 is right-shifted over the bottom electrodes 5, the measured output voltage Voutm1, which is a sinusoidal waveform, has a lower amplitude than the input voltage Vin, since the first capacitor C0 value is less than the third capacitor C2.

In this way, advantageously according to an embodiment of the invention, starting from the first output voltage signal Vout of the alignment measurement system 100,101, the entity as well as the direction of the measured displacement are derived.

Figure 7B:
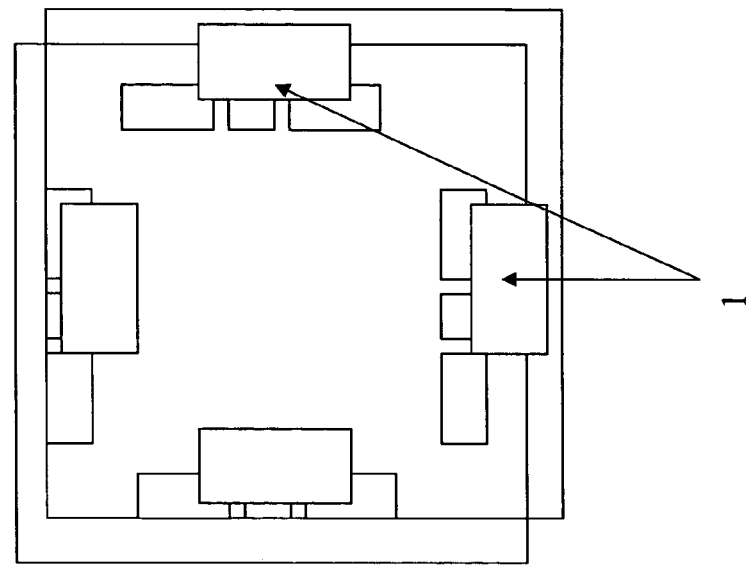
FIGS. 7A-7B show a multi-axis-sensors distribution used by the alignment measurement system according to an embodiment of the present invention.
Figure 7A:
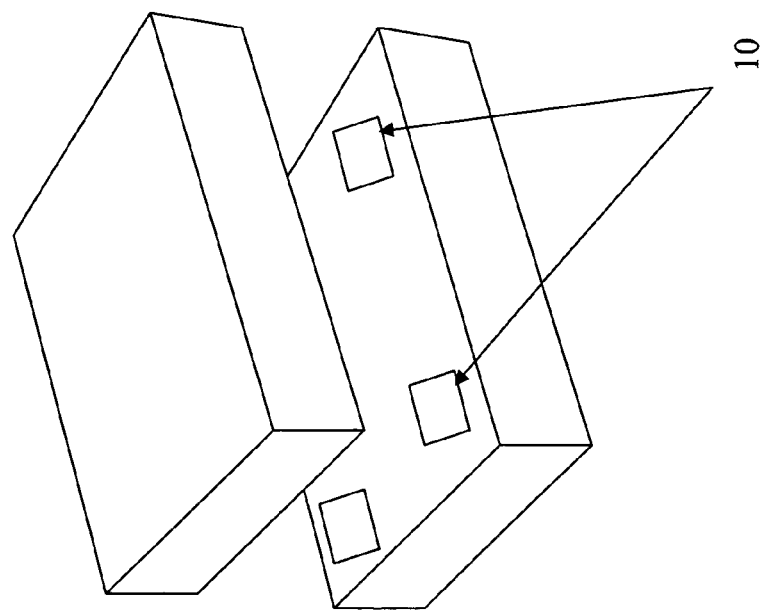

According to another embodiment, a four-electrode sensor 1 has been distributed along the perimeter on the chip plane to detect position information in the X and Y directions, while a three-electrode sensors 10 have been located in the four corners of the chip to enable measure of displacement in Z direction and also to provide a tilt measurement, as shown in FIG. 7. A combination of four-electrode sensors 1 and three-electrode sensors 10, on the chip plane, is also enabled to measure of displacement related to the rotation.

So, the alignment measurement system 100, 101 according to embodiments of the present invention allow measuring displacement in the X, Y, Z directions between chips assembled in a three-dimensional (3D) stacking configuration having a greater precision with respect to the known measurement devices.

Also, advantageously according to an embodiment of the invention, since the upper electrode of the employed integrated sensors is electrically insulated, the alignment measurement system 100, 101 according to embodiments of the present invention make it possible to perform measurements at an early stage of packaging because the top chip does not need any power supply.

In addition, the alignment measurement system 100, 101 is able to measure a post-bonding accuracy and feeds data back to the external manipulator to validate and compare the alignment information.

From the foregoing it will be appreciated that, although specific embodiments of the invention have been described herein for purposes of illustration, various modifications may be made without deviating from the spirit and scope of the invention.

The invention claimed is:

1. Alignment measurement system for measuring alignment between a plurality of chips of a device, the chips being assembled in a three-dimensional stacking configuration and equipped and coupled with at least an integrated capacitive sensor, wherein the system comprises:
   a multiple-capacitor structure integrated in said capacitive sensor
   at least a sensing circuit including at least a differential amplifier inserted between the first and second voltage references and having:
   a first input terminal connected to a first terminal of said multiple-capacitor structure,
   a second input terminal connected to a generator of a reference voltage,
   a third input terminal receiving an input voltage and
   an output terminal connected to a second terminal of said multiple-capacitor structure,
   which issues an output voltage, proportional to a variation of a capacitive value of the multiple-capacitor structure of the integrated capacitive sensor and corresponding to a measured misalignment between the chips of the device.

2. Alignment measurement system according to claim 1, wherein said multiple-capacitor structure comprises a first capacitor element connected to said first input terminal, and second capacitor element connected to said output terminal.

3. Alignment measurement system according to claim 2, wherein said multiple-capacitor structure further comprises a third capacitor element connected between said third input terminal and a common point of said first capacitor element and second capacitor element.

4. Alignment measurement system according to claim 3, wherein said output voltage is also proportional to a lateral direction of measured misalignment between the chips of the device.

5. Alignment measurement system according to claim 3, further comprising a sum amplifier having a first input terminal connected, through a series of a buffer and a first resistor to the generator of the input voltage, a second input terminal connected to the generator of the reference voltage and an output terminal connected to a second output terminal of the system, the second output terminal issuing a second output voltage signal corresponding to a entity of a total measured misalignment between the chips of the device.

6. Alignment measurement system according to claim 5, wherein the output terminal of the sum amplifier is also connected to its first input terminal by means of a second resistor and to the output terminal of the sensing circuit through a series of the second resistor, of a third resistor and of a further buffer.

7. Alignment measurement system according to claim 3, wherein the output terminal of the sensing circuit is connected to a first output terminal through a buffer.

8. Alignment measurement system according to claim 3, wherein the sensing circuit is an analog integrated read-out circuit.

9. Alignment measurement system according to claim 3, wherein the output voltage of the output terminal of the sensing circuit is proportional to the input voltage of the third input terminal.

10. Alignment measurement system according to claim 1, wherein the first and third input terminals are connected to each other, through a reference capacitor and the sensing circuit is a charge integrator.

11. Alignment measurement system according to claim 10, wherein a differential of the output voltage of the output terminal of the sensing circuit is proportional to a differential of the input voltage.

12. Alignment measurement system according to claim 1, wherein the differential amplifier comprises an operational amplifier cascade-connected to an output stage, the operational amplifier and the output stage being inserted between the first and second voltage references.

13. Alignment measurement system according to claim 12, wherein the operational amplifier has a first input terminal connected to second input terminal, a second input terminal connected to the generator of the reference voltage, as well as first and second output terminals connected to the output stage and comprises:
- a first and a second transistors connected to the second voltage reference by respectively third and fourth transistors and to the first voltage reference by means of a bias transistor, the bias transistor having a control terminal connected to a generator of a bias voltage
- the first and second transistors having respective control terminals connected to the first and second input terminals of the operational amplifier,
- the third and fourth transistors having respective control terminals connected to each other, the third transistor being diode-connected.

14. Alignment measurement system according to claim 13, wherein the control terminal of the bias transistor is connected to the first output terminal of the operational amplifier.

15. Alignment measurement system according to claim 13, wherein the second and fourth transistors are interconnected at the second output terminal of the operational amplifier.

16. Alignment measurement system according to claim 13, wherein the output stage comprises a first and second transistors which are series-connected between the first and second voltage references and are interconnected at the output terminal of the sensing circuit.

17. Alignment measurement system according to claim 16, wherein the first and second transistors of the output stage have respective control terminals connected to the first and second output terminal of the operational amplifier.

18. Alignment measurement system according to claim 13, wherein the operational amplifier is a low impedance AC high gain amplifier.

19. Alignment measurement system according to claim 1, further comprising a switch inserted between the generator of the reference voltage and the first input terminal.

* * * * *